United States Patent [19]

Fletcher

[11] 3,718,876

[45] Feb. 27, 1973

[54] SEALED CONTACT MATRIX SWITCH HAVING A FLEXIBLE MEMBRANE AT A CROSSPOINT OPENING

[75] Inventor: Roger Florin Fletcher, Columbus, Ohio

[73] Assignee: Bell Telephone Laboratories, Incorporated, Murray Hill, N.J.

[22] Filed: March 15, 1972

[21] Appl. No.: 234,909

[52] U.S. Cl. ......335/152, 317/101 CC, 317/101 CP, 317/101 F, 335/112

[51] Int. Cl. ............................................H01h 67/30

[58] Field of Search......335/108, 112, 152, 151, 154; 317/101 CC, 101 CP, 101 E

[56] References Cited

UNITED STATES PATENTS

| | | | |
|---|---|---|---|
| 3,454,911 | 7/1969 | Rouzier et al. | 335/112 |
| 3,576,507 | 4/1971 | Kunz | 335/112 |

*Primary Examiner*—Roy N. Envall, Jr.
*Attorney*—R. J. Guenther et al.

[57] ABSTRACT

A flexible membrane is disclosed which extends over an aperture in a support plate in an electromagnetic sealed contact matrix or ferreed type switch. The ferreed switch includes at least one circuit path element and the flexible membrane joins the circuit path element to the support plate and extends the circuit path element over the aperture to a point of rigid contact with a conductor lead projecting from an associated sealed contact switch.

8 Claims, 6 Drawing Figures

SEALED CONTACT MATRIX SWITCH HAVING A FLEXIBLE MEMBRANE AT A CROSSPOINT OPENING

BACKGROUND OF THE INVENTION

1. Field of the Invention

This application relates to switching devices of the sealed contact matrix or so-called ferreed type and pertains, in particular, to those in which sealed contact switches disposed in a matrix array are connected to electrical circuitry contained on at least one of two parallel support plates.

2. Description of the Prior Art

A typical ferreed switch is disclosed in U.S. Pat. No. 3,606,678, issued to N. Wasserman on Sept. 21, 1971. Generally, however, a ferreed switch comprises circuit path elements arranged on one or both of two support plates and a quantity of glass encapsulated sealed contact switches disposed between the two support plates in a matrix array. If warranted, a magnetic shunt plate may be sandwiched between the two support plates.

Each sealed contact switch has projecting conductor leads designed to electrically engage circuit path elements on the support plates. Moreover, both support plates contain apertures to accommodate passage of the conductor leads. In one support plate, however, the apertures are enlarged. As a result, an entire sealed contact switch can easily be inserted or removed through the aperture.

The size of the cross section of the large apertures, however, requires the portion of a circuit path element which engages the conductor lead projecting through the large aperture to extend as a cantilever. The resulting conductor system comprises two extended conducting members which are joined at one end, project away from their junction at right angles and which have their other ends rigidly supported. That system is subject to force variations and any stress which is otherwise unabsorbed by the system will be applied to the points of fixed attachment; i.e., at the support plate or in the glass seal of the sealed contact switch. If the magnitude of the stress becomes excessive, fracture will occur and the ferreed switch will fail.

Accordingly, one object of this invention is to avoid the imposition of excessive stress to the points of attachment between conductor leads, the circuit path elements and their supporting structure.

Another object of this invention is to facilitate manufacture of ferreed switches.

SUMMARY OF THE INVENTION

In accordance with a preferred embodiment of this invention, stress relief is achieved by extending a flexible membrane across the aperture in the support plate and disposing the circuit path elements thereon.

According to one feature of this invention, manufacture of a ferreed switch is facilitated by integrating the circuit path elements into the flexible membrane as, for example, by the use of a flexible printed circuit tape.

DETAILED DESCRIPTION

The conventional ferreed switch comprises a plurality of switch units, control circuitry to operate the switch units, one or more support plates to hold the switch units in a suitable array, circuit path elements on the support plates to electrically cooperate with the switch units, terminals to engage external circuitry and assorted hardware to hold the components together as a rigid unit. If the design warrants, a magnetic shunt plate can be sandwiched between the two support plates.

Figure 1:
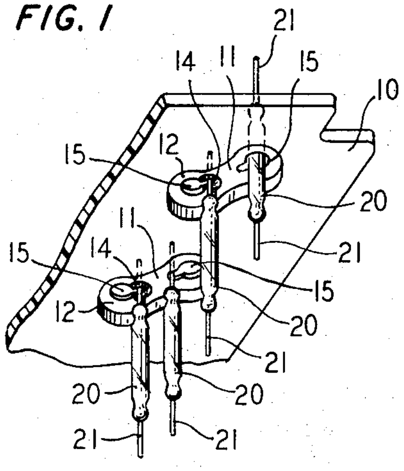
FIG. 1 is a fragmentary view of a portion of a ferreed switch in which a flexible membrane extends across apertures in a support plate and cooperates with an array of sealed contact switches.

Referring to FIG. 1, a fragmentary portion of a ferreed switch is disclosed in which a support plate 10 cooperates with a number of sealed contact switches 20. The support plate 10 is a planar member made of an electrically insulating material such as phenolic or epoxy-coated paper. It is substantially rigid, includes one or more apertures 11 and its surface is covered by a flexible membrane 12.

In the embodiment illustrated in FIG. 1, each aperture 11 comprises two large openings linked by a narrow neck. The large openings may have any convenient dimensions so long as they are large enough to permit free passage of a sealed contact switch 20.

Figure 2:
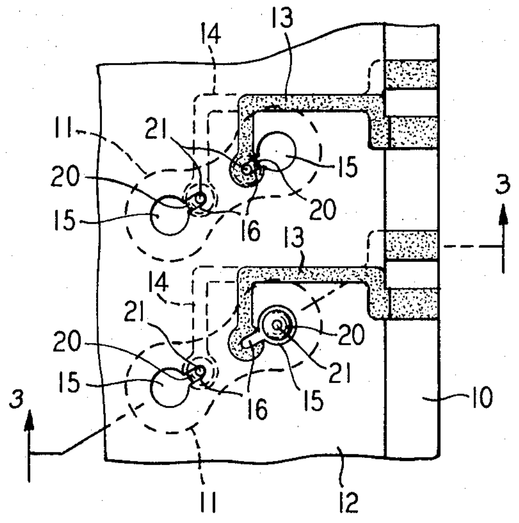
FIG. 2 is a top plan view of the fragmentary portion of the ferreed switch shown in FIG. 1.
Figure 3:
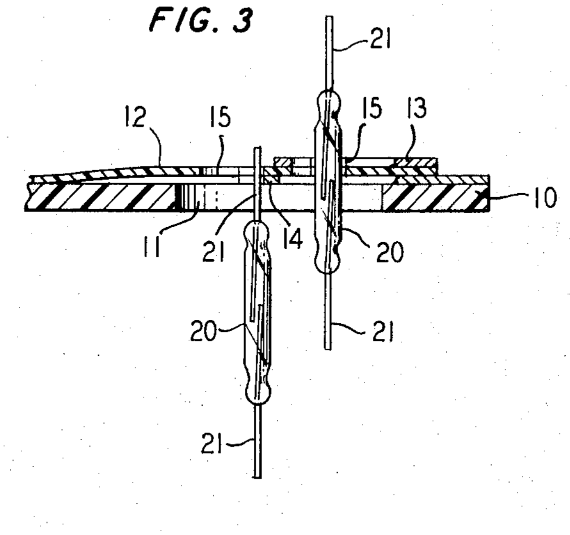
FIG. 3 is a fragmentary elevation view of the portion of the ferreed switch illustrated in FIG. 2 and is taken in section along the line 3—3.

The membrane 12 is made of a material which can readily be flexed and compressed as, for example, epoxy impregnated dacron. As best seen in FIGS. 2 and 3, it supports circuit path elements 13 and 14. Advantageously, the membrane 12 is bonded to the support plate 10 as, for example, by a pressure sensitive film (not shown). The circuit path elements 13 and 14 are advantageously made from strips of conducting metal such as copper and, in the illustrated embodiment, are disposed on either side of the membrane 12. It will be recognized, of course, that circuit path elements can be restricted solely to one side or the other of the membrane as the design warrants.

Figure 4:
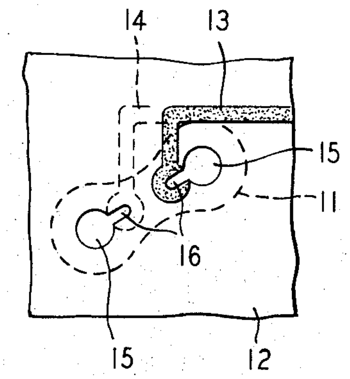
FIG. 4 is an enlarged plan view of a part of the top surface of the fragmentary portion of the ferreed switch shown in FIG. 1.

In the embodiment shown in FIG. 4, the membrane 12 has two openings 15 associated with each aperture 11. Each opening 15 may have any convenient dimensions except that it must be large enough to permit passage of a sealed contact switch 20 and it must also include a notch 16. The notches 16 penetrate the circuit path elements 13 and 14 so as to form keyways permitting entry therein of conductor leads 21 projecting from sealed contact switches 20.

The sealed contact switches 20 are conventional devices of the type known as reed switches. Generally, each comprises two magnetically responsive reed contacts which are encapsulated in a glass container in spaced-apart, overlapping relationship. As best seen in FIG. 1, a sealed contact switch 20 is inserted endwise into the ferreed switch, through a hole 15. As it is inserted, it is angled as necessary to allow its leading conductor lead 21 to enter a hole (not shown) in a second support plate (not shown). Next, the sealed contact switch 20 is straightened until the following conductor lead 21 enters its associated notch 16. After all the sealed contact switches 20 are so inserted, electrical connection to the appropriate circuit path elements is finalized as, for example, by wave soldering. To facilitate soldering, the circuit path elements 14 are through-plated; that is, a conducting portion of each extends through the membrane 12 to the upper surface thereof to a position adjacent the circuit path elements 13. Thus, all soldering occurs on the upper or outer surface of the membrane 12.

The insertion holes 15 also facilitate maintenance during use. Specifically, if an individual sealed contact switch 20 becomes defective, it can readily be removed through an inserting hole 15 and replaced by a new unit.

Figure 5:
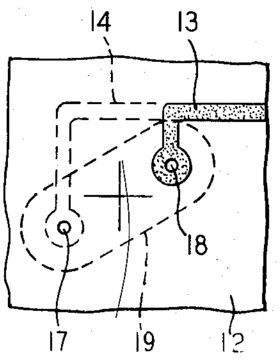
FIG. 5 is a plan view of an alternative form of the portion of a ferreed switch illustrated in FIG. 4.

The foregoing embodiment contemplates insertion of the sealed contact switches 20 after the ferreed switch is partially assembled; i.e., after the two support plates are joined by appropriate mounting hardware. The embodiment illustrated in FIGS. 5 and 6, however, contemplates joinder of the support plate 10 to the sealed contact switches 20 only after the switches have first been attached to a second support plate (not shown). In the latter embodiment, as best seen in FIG. 5, two holes 17 and 18 are perforated through the membrane 12 within the perimeter of each aperture 19. The diameter of each hold, however, is just large enough to accommodate a conductor lead 21. Moreover, the apertures 19 have an oval configuration. As before, the circuit path element 14 is through-plated via the hole 17 to the upper or outer surface of the membrane 12 so as to facilitate soldering.

Figure 6:
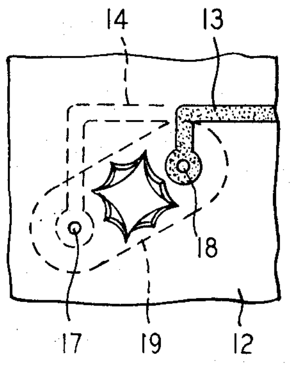
FIG. 6 is a plan view of the embodiment illustrated in FIG. 5 showing the flexible membrane partially opened to accept the insertion of a sealed contact switch.

A particular advantage of the embodiment illustrated in FIGS. 5 and 6 is that inserting holes can be eliminated without loss of serviceability. That is, a sealed contact switch 20 which becomes defective in service can still be readily replaced. As shown in FIG. 5, for example, a cross is slit into the membrane 12. Thereafter, as shown in FIG. 6, the corners of the cross-slits are peeled back so as to expose the underlying space. The defective sealed contact switch 20 can then be removed through the opening and a new sealed contact switch 20 can be inserted and installed as required.

A further advantage is achieved if a single membrane 12 extends over all of the apertures in the support plate 20. In one application, for example, the flexible membrane 12 is made from a so-called flexible printed circuit tape; i.e., a flat, flexible member in which printed circuitry is embedded. When this is done, conventional batch processing techniques for making flexible circuit tapes can readily be adapted to the fabrication of ferreed switches and substantial savings and efficiency can be achieved.

In summary, an arrangement has been disclosed in which a flexible membrane cooperates with circuit path elements, a support plate and sealed contact switches to produce an improved ferreed switch which can be adapted to manufacturing procedures using flexible printed circuit tape techniques. While several embodiments have been disclosed, it will be understood that they are merely representative of the invention and that others falling within the scope of the invention will readily occur to those skilled in the art.

What is claimed is:

1. An electromagnetic matrix switching device including a support plate having at least one enlarged aperture, at least one circuit path element extending over said aperture, at least one sealed contact switch small enough to pass through said aperture, a conductor lead from said sealed contact switch projecting through said aperture and making rigid contact with said circuit path element and support means for positioning said circuit path element over said aperture CHARACTERIZED IN THAT said support means includes a flexible membrane covering said aperture and joining said circuit path element to said support plate.

2. An electromagnetic matrix switching device in accordance with claim 1 wherein said circuit path element is an integral part of said flexible membrane.

3. An electromagnetic matrix switching device in accordance with claim 2 wherein said flexible membrane comprises a flexible printed circuit tape bonded to said support plate.

4. An electromagnetic matrix switching device in accordance with claim 1 wherein said flexible membrane is perforated to allow insertion and removal therefrom of sealed contact switches.

5. An electromagnetic matrix switching device in accordance with claim 4 wherein each perforation includes a major portion having dimensions large enough to accommodate passage of a sealed contact switch and a minor portion extending into said circuit path element to form a keyway for accepting said conductor lead.

6. An electromagnetic matrix switching device in accordance with claim 1 wherein a second sealed contact switch is located at each aperture.

7. An electromagnetic matrix switching device in accordance with claim 6 wherein said aperture comprises two large openings linked by a narrow neck and one sealed contact switch is disposed centrally in each large opening.

8. An electromagnetic matrix switching device in accordance with claim 7 wherein said flexible membrane has circuit path elements on both sides thereof.

* * * * *

UNITED STATES PATENT OFFICE
CERTIFICATE OF CORRECTION

Patent No. 3,718,876 Dated February 27, 1973

Inventor(s) Roger F. Fletcher

It is certified that error appears in the above-identified patent and that said Letters Patent are hereby corrected as shown below:

Column 4, line 22, (Claim 1) after "and" delete "support means" and insert --a flexible membrane covering said aperture and adapted--;
line 24, after "said" delete "support means in-";
line 25, delete "cludes a",
after "membrane" insert --is bonded to said support plate and includes an opening large enough to permit passage therethrough of said sealed contact switch.--,
delete "covering said aperture and";
line 26, delete "joining said circuit path element to said support plate.".

Column 4, cancel claim 4.

Column 4, line 39, (Claim 5) after "claim" delete "4" and substitute therefor --1--,
after "each" delete "perforation" and substitute therefor --opening--.

Column 4, line 47, (Claim 6) after "each" delete "aperture" and substitute therefor --opening--.

UNITED STATES PATENT OFFICE
CERTIFICATE OF CORRECTION

Patent No. 3,718,876 Dated February 27, 1973

Inventor(s) Roger F. Fletcher

It is certified that error appears in the above-identified patent and that said Letters Patent are hereby corrected as shown below:

Column 4, line 49, (Claim 7) after "said" delete "aperture" and substitute therefor --opening--;
line 50, after "large" delete "openings" and substitute therefor --perforations--;
line 52, delete "opening" and substitute therefor --perforation--.

On the cover sheet, after the abstract, "8 Claims" should read -- 7 Claims --.

Signed and sealed this 26th day of February 1974.

(SEAL)
Attest:

EDWARD M.FLETCHER,JR.
Attesting Officer

C. MARSHALL DANN
Commissioner of Patents